United States Patent
Walsh et al.

(10) Patent No.: US 9,348,054 B2
(45) Date of Patent: May 24, 2016

(54) NMR MEASUREMENT OF ENGINEERED FLOW MANAGEMENT STRUCTURES

(75) Inventors: David O. Walsh, Mukilteo, WA (US); Elliot D. Grunewald, Seattle, WA (US)

(73) Assignee: VISTA CLARA INC., Mukilteo, WA (US)

( * ) Notice: Subject to any disclaimer, the term of this patent is extended or adjusted under 35 U.S.C. 154(b) by 883 days.

(21) Appl. No.: 13/541,706

(22) Filed: Jul. 4, 2012

(65) Prior Publication Data
US 2014/0009148 A1    Jan. 9, 2014

(51) Int. Cl.
| G01V 3/00 | (2006.01) |
| G01V 3/14 | (2006.01) |
| G01R 33/563 | (2006.01) |
| G01V 3/32 | (2006.01) |

(52) U.S. Cl.
CPC ............... *G01V 3/14* (2013.01); *G01R 33/563* (2013.01); *G01V 3/32* (2013.01)

(58) Field of Classification Search
CPC .................................................. G01R 33/563
USPC ................................ 324/306, 303
See application file for complete search history.

(56) References Cited

U.S. PATENT DOCUMENTS

| 3,667,035 | A | 5/1972 | Slichter |
| 4,710,713 | A | 12/1987 | Strikman |
| 5,428,291 | A * | 6/1995 | Thomann et al. ............. 324/303 |
| 6,046,587 | A * | 4/2000 | King et al. .................... 324/306 |
| 6,794,865 | B2 * | 9/2004 | Astley et al. .................. 324/306 |
| 7,028,557 | B2 * | 4/2006 | Martin et al. ............. 73/861.08 |
| 7,358,734 | B2 | 4/2008 | Blümich |
| 7,466,128 | B2 | 12/2008 | Walsh |
| 7,741,841 | B2 | 6/2010 | Edwards |
| 8,659,293 | B2 * | 2/2014 | Krioutchkov et al. ........ 324/307 |
| 8,860,412 | B2 * | 10/2014 | Leveridge et al. ............ 324/303 |

OTHER PUBLICATIONS

Walsh et al., U.S. Appl. No. 13/356,381, "NMR Logging Apparatus", filed Jan. 23, 2012 (not yet published).

* cited by examiner

*Primary Examiner* — Louis Arana
(74) *Attorney, Agent, or Firm* — Nathaniel A. Gilder; Jensen & Puntigam, PS

(57) ABSTRACT

Nuclear Magnetic Resonance (NMR) measurement apparatus, NMR sensors, NMR measurement methods are disclosed to determine NMR properties of engineered flow management structures, and to estimate engineering properties using determined NMR properties. Example engineered flow management structures include engineered water storage, water management, water production, water sampling structures, and/or structures that serve as conduits or barriers to water movement. Technologies disclosed herein are also applicable to measuring properties relating to other fluid and/or gas flow in engineered flow management structures.

26 Claims, 7 Drawing Sheets

NMR MEASUREMENT OF ENGINEERED FLOW MANAGEMENT STRUCTURES

BACKGROUND

A variety of engineered flow management structures are commonly used to store, manage, distribute, produce, sample and prospect for water. Man-made dams of earthen or other engineered materials are commonly used as barriers to flow and/or to store and manage surface water resources. Man-made levees and canals of earthen or other engineered materials are commonly used to divert, contain and distribute surface water. Slurry walls, grout curtains, and retaining walls are constructed to restrict, divert, or direct the flow of subsurface groundwater. Wells and boreholes which contain engineered structures are commonly used to prospect for, produce, and manage groundwater resources.

Wells are also constructed to achieve other flow management purposes. For example a well can be cased with cement, PVC pipe, or any number of other engineered materials to allow for controlled extraction of subsurface fluids or gas. Cased wells are often screened or perforated within in certain intervals, to facilitate flow of water, hydrocarbons or other fluids from a subsurface formation to the inner casing of the well. Within intervals where wells are cased and not screened or perforated, it is commonly desirable that well casings provide a barrier to fluid flow into or out of the well.

Sometimes an annular space between the casing or screen and the surrounding formation is backfilled with earthen or other engineered materials such as gravel, sand, cement or grout to affect fluid movement. For example, impermeable materials such as bentonite, grout and cement are often introduced in this annular space to act as a barrier to flow within the annular space. On the other hand, more permeable materials such as gravel and sand are often introduced into the annular space to facilitate the free flow of groundwater between the formation and the well. Such engineered well completions including filter packs and/or grouting are important for controlling and maintaining flow within a well and the structural stability of the well, whether for the purpose of extracting groundwater, other fluids, or gases from the formation or for the purpose of injecting fluids into the formation.

SUMMARY

Technologies disclosed herein include Nuclear Magnetic Resonance (NMR) measurement apparatus, NMR sensors, and/or NMR measurement methods to determine NMR properties of engineered flow management structures, and to estimate engineering properties using determined NMR properties. Example engineered flow management structures include engineered water storage, water management, water production, water sampling structures, and/or structures that serve as conduits or barriers to water movement. Technologies disclosed herein are also applicable to measuring properties relating to other fluid and/or gas flow in engineered flow management structures.

BRIEF DESCRIPTION OF THE DRAWINGS

Various features and attendant advantages of the disclosed technologies will become fully appreciated when considered in conjunction with the accompanying drawings, in which like reference characters designate the same or similar parts throughout the several views, and wherein.

DETAILED DESCRIPTION

Figure 1:
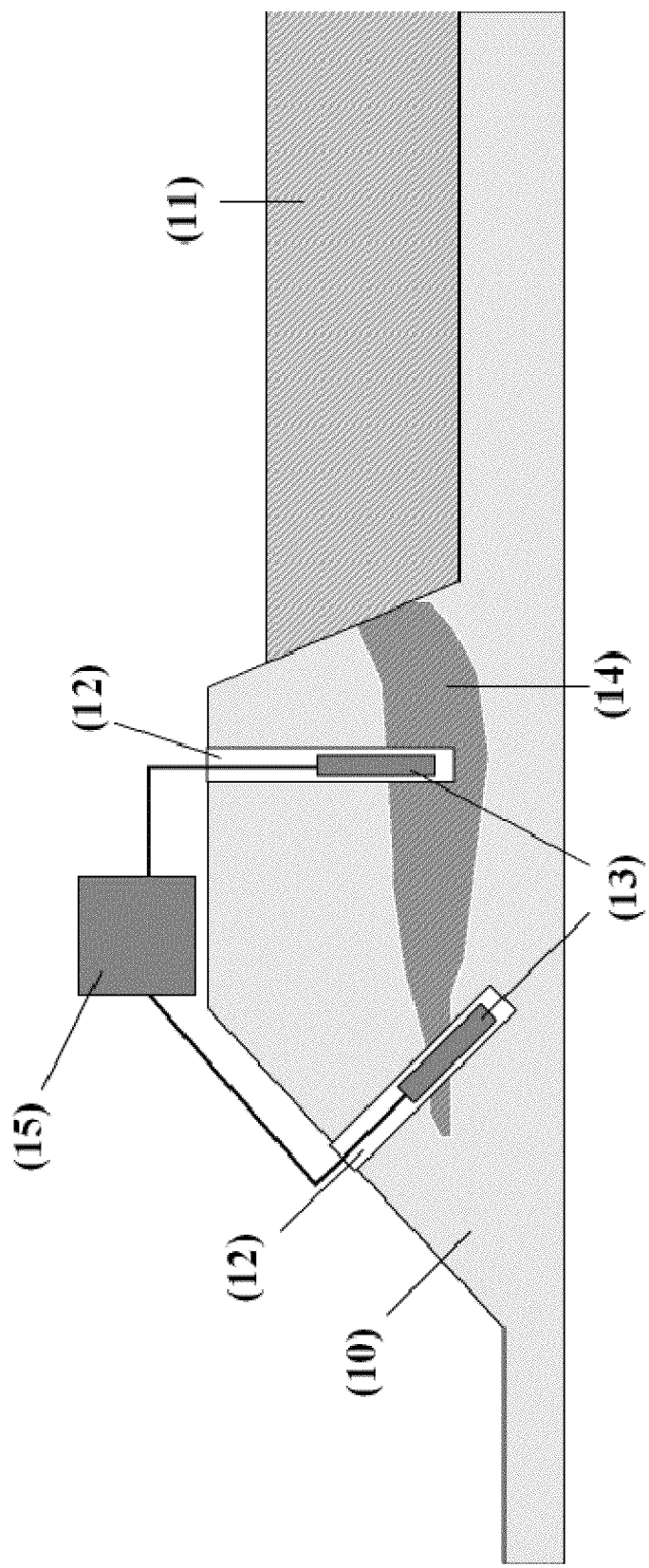
FIG. 1 depicts an example NMR measurement apparatus performing NMR measurements in an engineered flow management structure.

Prior to explaining embodiments of the invention in detail, it is to be understood that the invention is not limited to the details of construction or arrangements of the components and method steps set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

Technologies according to this disclosure may include, inter alia, NMR measurement apparatus, NMR sensors, and/or NMR measurement methods to determine engineering performance properties of engineered flow management structures.

In some embodiments, NMR measurements according to this disclosure may comprise in-situ NMR measurements. In-situ NMR measurements may comprise NMR measurements made using one or more in-situ NMR sensors. In-situ NMR sensors may comprise NMR sensors that are deployed permanently or semi-permanently on or in a formation subject to NMR measurement, such as an engineered flow management structure and/or surrounding formation. In-situ NMR sensors may comprise for example sensors that are "built in" to an engineered flow management structure, or sensors that are bolted or otherwise affixed thereto so that they may be attached to NMR measurement apparatus and used to conduct NMR measurements over periods longer than one day, e.g., over weeks, months, or years.

Example NMR sensors may comprise any type of NMR sensor capable of measuring NMR precession of water or other fluid within the engineered flow management structure. NMR sensors may be designed to perform NMR measurements in the Earth's magnetic field, or in another localized static magnetic field produced by electromagnets or permanent magnets, or in some combination of both. In some embodiments, NMR sensors may comprise one or more induction coils, superconducting quantum interference devices (SQUIDS), micromechanical cantilevers, and/or any other device capable of measuring NMR responses within the engineered flow management structure.

In embodiments wherein the static magnetic field includes a source other than the Earth's magnetic field, static magnetic field generating devices may be located either inside the structure or external to the structure. Static magnetic field generating devices may include permanent magnets, temporary magnets, and/or electromagnets. In some embodiments, NMR sensors may include one or more static magnetic field generating devices; for example, when a combined NMR sensor and static magnetic field generating device is implemented as an induction coil conducting Direct Current (DC). In some embodiments, static magnetic field generating devices may be deployed separately from NMR sensors.

NMR measurement apparatus deployed in connection with this disclosure may include NMR sensors such as those described above as well as receive electronics, power amplifiers, data acquisition systems, controllers or computers, power sources and other components. Any combination of such components, excluding the NMR sensors, may be referred to herein as "control electronics". In some embodiments, control electronics may be located either within or outside the engineered flow management structure, depending on convenience and desired detection performance. In some embodiments, for example, a single induction coil may be used as the NMR sensor for detecting NMR precession of spins within the structure, and only the induction coil used for detection may to be located within the engineered flow management structure, as shown in FIG. 3. In some embodiments, additional NMR sensors may be located within the structure, for example as shown FIGS. 1, 2 and 4.

In general, control electronics may be configured to control NMR measurements. Control electronics may comprise, inter alia, a computing device equipped with computer readable media configured to carry out various aspects of the methods disclosed herein. Control electronics may be configured to utilize or generate a static magnetic field within a sample volume, e.g., within an engineered flow management structure. Control electronics may be configured to control generation of NMR excitation pulses, e.g., by activating a power source, power amplifier and/or signal generator to transmit one or more electromagnetic pulses into the sample volume. Pulsed fields may be transmitted at a Larmor frequency of a background magnetic field. Control electronics may optionally also be configured to generate and terminate a prepolarizing background magnetic field to generate NMR excitation signals.

Control electronics may be configured to switch from transmit mode into receive mode, for example by activating switches on transmit and receive electronics, to perform Analog to Digital (A/D) conversion of received NMR signals, to optionally process the received NMR signals and store the received NMR signals and/or corresponding NMR data. In some cases, NMR measurement may involve emitting multiple electromagnetic pulses in rapid succession and measuring the NMR responses between the electromagnetic pulses. The measured NMR responses provide useful information about the NMR properties within the sample volume, which NMR properties may be used to determine or estimate the engineering performance properties of interest herein.

Engineered flow management structures may comprise any man-made structures affecting fluid or gas flow, whether or not flow management is the primary purpose of the structure. Example engineered flow management structures include dams, levees, well casings, pipelines, water management structures, and/or any of the various structures referenced herein.

In some embodiments, an NMR sensor may be located within an engineered flow management structure and may be partially or completely surrounded by the material of the engineered structure. The deployment of the NMR sensor within the structure of interest can be accomplished in a number of different ways. For example, the NMR sensor can be deployed temporarily or permanently through a borehole or access tube that is located in a portion of the structure. Alternately, the NMR sensor may be deployed by a direct push tool, which makes a temporary borehole or access tube in the structure. Alternately the NMR sensor, or a portion thereof, can be embedded in the structure during the construction of the structure or during a modification or re-engineering of the structure. For example an in-situ NMR detection coil, and some or all of the associated NMR measurement apparatus electronics can be embedded within a water management structure, such as a dam, levee or water well, during the initial construction of the structure, for the purpose of performing in-situ NMR measurements within the structure during the construction thereof and/or after construction has been completed.

In some embodiments, an NMR sensor located within an engineered flow management structure may be used to perform NMR measurements for the purpose of estimating engineering performance properties of the engineered flow management structure. Engineering performance properties may include mechanical, hydraulic, structural and/or other properties affecting fluid and/or gas flow in, through, and/or surrounding an engineered flow management structure. Engineering performance properties may also be referred to herein as engineering properties.

Engineering performance properties may be determined and/or estimated using NMR measurement results, including NMR measurement results relating to: water saturation, other fluid saturations, porosity, mean pore size, pore size distributions, permeability or hydraulic conductivity, tortuosity, density, flow velocity and fluid diffusion. These are referred to herein as NMR properties. Such NMR properties, and/or changes in such NMR properties over a series of NMR measurements, may be used to determine and/or estimate engineering performance properties of engineered flow management structures, and accordingly, in some embodiments, technologies disclosed herein may be configured to facilitate and/or generate engineering performance property determinations and/or engineering performance property monitoring of engineered flow management structures.

NMR measurement techniques that may be useful for NMR measurements for use in determining NMR properties of structures include: free induction decay (FID) measurements, spin echo measurements, Carr-Purcell-Meiboom-Gill (CPMG) measurements, inversion recovery (INVREC) measurements, saturation recovery (SATREC) measurements, and diffusion measurements. A variety on NMR measurement techniques are known to those of skill in the art and any known techniques may be deployed as appropriate in embodiments of this disclosure.

NMR measurement methods according to this disclosure may determine NMR properties at a single point in time and/or at multiple points in time, and corresponding engineering performance properties may likewise be determined at a single point in time and/or at multiple points in time. Temporal changes in NMR properties that can be usefully detected and monitored over time, e.g. using in-situ NMR sensors to perform NMR measurements at multiple points in time, include changes in: water content or other fluid saturation, porosity, mean pore size, pore size distributions, permeability or hydraulic conductivity, tortuosity, density, flow velocity and fluid diffusion.

In some embodiments, methods according to this disclosure may detect engineering performance property changes in the ability of an engineered flow management structure to either prevent the flow of water or other fluid (such as in the case of a dam or levee), or to accommodate the flow of water or other fluid (such as in the case of an engineered filter pack in the annulus of a water producing well). Flow prevention detection may be implemented by making NMR measurements to determine NMR properties, and using the NMR properties to determine engineering performance properties indicating deterioration in the integrity of a water retaining structure, or properties indicating water pressure and/or distribution, over time, and comparing NMR properties and/or engineering performance properties to determine changes in engineering performance properties.

Flow accommodation detection may be implemented by performing measurements to determine NMR properties, and using the NMR properties to determine engineering performance properties in the annular space of a production well, over time, and comparing NMR properties and/or engineering performance properties to determine changes in engineering performance properties. Engineering performance properties for use in flow accommodation detection may include any properties that could be responsible for declining production efficiency in the well, and may include properties that could be modified or otherwise addressed through follow-on well development activities.

In some embodiments, methods according to this disclosure may measure bulk properties of engineered flow management structures, and may optionally resolve spatially localized properties of the structure. The degree of localization available may depend upon the design of the NMR sensor, and could include effective localization in zero, one, two or three spatial dimensions. For example, some in-situ NMR sensors may be designed to include a detection coil configured to be simultaneously sensitive to a large portion of the engineered flow management structure. Alternately, some in-situ NMR sensors may be designed to provide localized sensitivity over a relatively small percentage of the volume of the structure. One dimensional (1D), two dimensional (2D), and/or three dimensional (3D) spatially resolved measurements may be performed by repeating NMR measurements at multiple 1D, 2D or 3D locations within the structure.

In embodiments in which an NMR sensor is deployed into the structure via a borehole or access tube, multiple measurements may be performed at different locations in the access tube to provide a 1D resolution of NMR properties for use in determining engineering performance properties. A multitude of sensors may be distributed in 1D, 2D, and/or 3D within engineered flow management structures and/or surrounding formations to provide enhanced spatial coverage and or resolution. Individual sensors may operate independent from other sensors or may be networked to provide a measurement array, such as a planar array, line array, or unstructured array.

Some embodiments of this disclosure may be configured to use one or more in-situ NMR sensors to measure NMR properties for use in determining engineering performance properties of dams, levees and/or canals. In-situ NMR measurements can be processed to detect increased water content within the dam, canal or levee structure, development or enlargement of internal cracks, enlargement of pore sizes and increased water saturation associated with construction or subsequent degradation or piping, and ultimately to indicate increased risk or failure of the dam, levee or canal structure.

FIG. 1 depicts an example NMR measurement apparatus performing NMR measurements in an engineered flow management structure. FIG. 1 comprises a dam (10), which is retaining a body of surface water (11), boreholes or access tubes (12), referred to collectively herein as access tubes, are installed in the dam (10) at one or more locations. NMR sensors (13) are positioned at one or more locations within the access tubes (12), and localized NMR measurements are performed with the NMR sensors (13) with sensitivity to water or fluid content (14) within the dam (10) surrounding the access tubes (12). NMR sensors (13) are connected to optional control electronics (15) via appropriate cabling.

In FIG. 1, dam (10) provides an example engineered flow management structure. It will be appreciated that techniques herein are similarly applicable to other engineered flow management structures such as levees, canals, wells, pipelines, slurry walls, grout curtains, retaining walls and/or similar structures.

In some embodiments according to FIG. 1, NMR sensors (13) and control electronics (15) may comprise any of a variety of NMR sensor and control electronics configurations, and this disclosure is not limited to any particular configuration thereof. For example, in some embodiments NMR sensors and corresponding control electronics may be designed for operation in Earth boreholes using Earth's magnetic field. Some example NMR sensor and control electronics designs are described in U.S. Pat. No. 3,667,035, entitled "Nuclear Magnetism Logging," issued on Mar. 17, 1972, which is incorporated by reference herein.

In some embodiments, NMR sensors (13) and control electronics (15) may comprise NMR sensors and corresponding control electronics designed for use with permanent magnets or other static magnetic field generation devices. Some example NMR sensor and control electronics designs are described in U.S. Pat. No. 4,710,713, entitled "Nuclear Magnetic Resonance Sensing Apparatus and Techniques," issued on Dec. 1, 1987, which is incorporated by reference herein. In some embodiments, an NMR logging tool may be designed with permanent magnets or other static magnetic field generation devices and also an NMR sensor detection coil within a downhole sensor.

In some embodiments, control electronics (15) may be located within an access tube (12) or else outside the access tubes (12). In some embodiments, NMR sensors (13) and control electronics (15) may comprise NMR sensor and control electronics designs described in U.S. patent application Ser. No. 13/356,381, entitled "NMR Logging Apparatus," which is incorporated by reference herein. In some embodiments, NMR sensors (13) and control electronics (15) may comprise single-sided NMR devices such as the "NMR Mouse" disclosed in U.S. Pat. No. 7,358,734 entitled "Single-Sided NMR Sensor with Microscopic Depth Resolution," issued on Apr. 15, 2008, which is incorporated by reference herein. In some embodiments, NMR sensors (13) and control electronics (15) may comprise potentially new NMR sensor and/or control electronics designs that may be uniquely adapted for use with embodiments of this disclosure.

In some embodiments, control electronics (15) may be configured to selectively connect and disconnect from NMR sensors (13), allowing NMR sensors (13) to remain in-situ while the control electronics (15) may be moved to other locations for other measurements and storage. In some embodiments, control electronics (15) may be permanently connected to NMR sensors (13) and may be designed to remain in place.

In some embodiments, control electronics (15) may be configured to perform NMR logging operations by activating components of control electronics (15) and NMR sensors NMR sensors (13) to perform NMR measurements at multiple points in time. For example, NMR measurements may be performed once (or any number of times) a day over a plurality of days, once (or any number of times) a week over a plurality of weeks, once (or any number of times) a month over a plurality of months, etc. In some embodiments, control electronics (15) may be configured to perform NMR measurements in response to detected conditions such as rain, earthquake, and/or flooding, and control electronics (15) may include appropriate condition sensors for such purposes. In some embodiments, control electronics (15) may be configured to perform NMR measurements in response to remote control signals, e.g., signals received via a modem connection to a communications network.

In some embodiments, control electronics (15) may be configured to store NMR measurement results, along with any other measurement information such as dates and times of measurements. Control electronics (15) may furthermore be configured to compare stored NMR measurement data to detect changes therein, thereby using NMR properties to determine engineering performance property changes in the dam (10). For example, in some embodiments each time control electronics (15) receives an NMR measurement, control electronics (15) may be configured to perform a comparison of the received measurement to one or more previously received measurements of the dam (10). Control electronics (15) may optionally be configured to send an alarm via a communications network when comparisons of stored NMR measurement data indicate changes in excess of predetermined safe or operationally desirable levels. Alternatively, NMR measurements may be compared by a human operator and/or other computing devices equipped with software configured to receive NMR measurements from control electronics (15) and to perform NMR measurement comparisons. In some embodiments, control electronics (15) may be configured to facilitate determining engineering performance properties using NMR properties, for example by displaying historical NMR measurement result data for human analysis.

In some embodiments, control electronics (15) may be configured to determine deterioration in the engineering performance properties. For example, in the case of engineered flow management structures designed to impede fluid flow, deterioration of engineering performance properties may be determined using NMR measurement comparisons to detect increased fluid flow. Example NMR properties associated with deterioration may include, for example, increased fluid saturation levels, increased mean pore size, increased porosity, pore size distributions consistent with more fluid flow capacity, increased permeability, and/or increased flow velocity. Control electronics (15) may be configured to detect and track deterioration and optionally to establish a degree of deterioration based on NMR property measurements. Conversely, control electronics (15) may be configured to detect and track stabilization or improvement in the engineering performance properties of the engineered flow management structure, by detecting changes of NMR properties over time associated with decreased fluid flow.

In the case of engineered flow management structures designed to facilitate fluid flow, determinations of deterioration of engineering performance properties may comprise comparisons of NMR properties indicating decreased fluid flow. Example NMR properties indicating decreased fluid flow, and therefore possibly associated with deterioration may include, for example, decreased fluid saturation levels, decreased mean pore size, decreased porosity, pore size distributions consistent with less fluid flow capacity, decreased permeability, and/or decreased flow velocity. Control electronics (15) may likewise be configured to detect and track NMR properties associated with deterioration and optionally to establish a degree of deterioration in engineering performance properties based on one or more NMR measurements.

In this case, stabilization or improvement in the engineering performance properties of the engineered flow management structure may be associated with NMR properties indicating increased fluid flow, which NMR properties may be detected and optionally tracked over time by control electronics (15), any computer configured to receive NMR measurement data therefrom, or a human operator of control electronics (15).

In some embodiments according to FIG. 1, the access tubes (12) for the NMR sensors (13) may be uncased, or cased in an appropriate non-conductive, non-magnetic casing material to allow penetration of Radio Frequency (RF) magnetic fields into the structure, e.g., as described in U.S. Pat. No. 7,741,841, entitled "Time Lapsed Diffusivity Logging for Monitoring Enhanced Oil Recovery," issued on Jun. 22, 2012, which is incorporated by reference herein. In some embodiments according to FIG. 1, the access tubes (13) may be filled with air, water or other fluids or gasses and may be either screened or unscreened. Alternatively the NMR sensors (13) may be advanced into and retracted from the dam (10) by mechanical means such as a direct push system.

Figure 2:
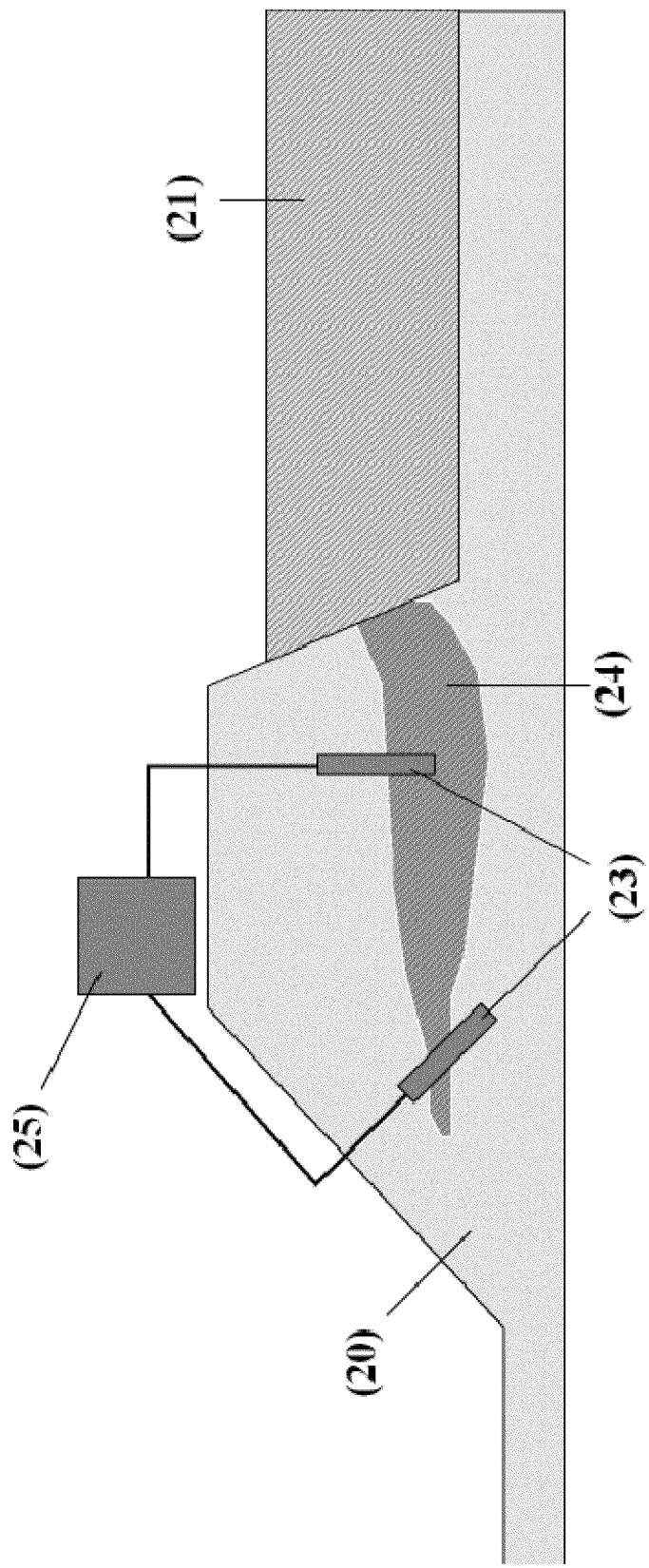
FIG. 2 depicts an example NMR measurement apparatus performing NMR measurements in an engineered flow management structure, wherein in-situ NMR sensors are embedded within the structure.
Figure 3:
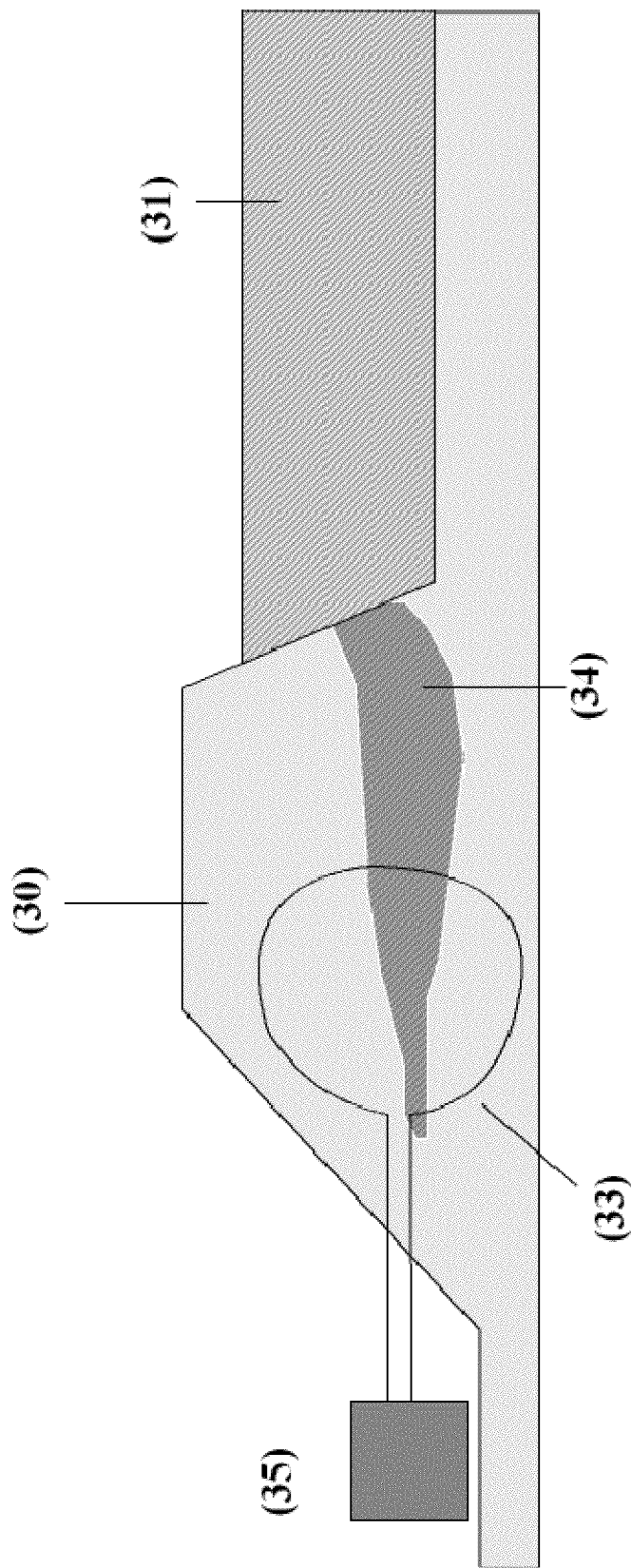
FIG. 3 depicts an example NMR measurement apparatus performing NMR measurements in an engineered flow management structure, wherein the NMR measurement apparatus comprises an Earth's field NMR detection device coupled with a detection coil embedded within the structure.

FIG. 2 depicts an example NMR measurement apparatus performing NMR measurements in an engineered flow management structure, wherein in-situ NMR sensors are embedded within the structure. FIG. 2 comprises in-situ NMR sensors (23) which may be permanently or semi-permanently embedded within an engineered flow management structure (20). In-situ NMR sensors (23) are coupled with control electronics (25) via appropriate cable or other connections. Structure (20) is retaining a body of surface water (21). Water or fluid content (44) is shown entering the structure (20).

In embodiments according to FIG. 2, in-situ NMR sensors (23) may be emplaced in the structure (20) during its construction, or after its construction through appropriate engineering modification to the structure (20). Control electronics (25) can be configured to use in-situ NMR sensors (23) to monitor changes to the NMR properties of the structure (20) over time. For example, the NMR apparatus comprising control electronics (25) and in-situ NMR sensors (23) may be configured to monitor NMR properties associated with water content (24) within the structure (20), and to detect changes therein, such as increases and decreases in fluid content due to flow of water or fluid content (44) into structure (24). Control electronics (25) can be configured to use the measured NMR properties to determine, or facilitate determination, of engineering performance properties of the structure (24), as well as changes in the engineering performance properties of the structure (24) over time.

Some example methods according to this disclosure may include installing in-situ NMR sensors (23) in an existing structure. Temporary boreholes may be installed by drilling or direct push methods to enable the in-situ NMR sensors (23) to be emplaced within the structure (20), and then the boreholes may be filled in with cement, grout or other useful material, leaving appropriate cable(s) in place to enable communication and power transfer between the embedded in-situ NMR sensors (23) and supporting control electronics (25).

In embodiments according to FIG. 2, the embedded in-situ NMR sensors (23) may comprise any NMR sensor that can usefully measure water and fluids within the surrounding structure (20), such as those described above in connection with FIG. 1. The NMR sensor may be constructed from any combination of static magnetic field generating device, NMR excitation field generating device, and NMR precession detection device that is suitable for the in-situ NMR measurement. Similarly, control electronics (25) may comprise any of a variety of control electronics designs as described above in connection with FIG. 1.

FIG. 3 depicts an example NMR measurement apparatus performing NMR measurements in an engineered flow management structure, wherein the NMR measurement apparatus comprises an Earth's field NMR detection device coupled with a detection coil embedded within the structure. In FIG. 3, an Earth's field NMR measurement apparatus comprises an in-situ detection coil (33) serving as an NMR sensor, and control electronics (35). Detection coil (33) is embedded within the engineered flow management structure (30). Engineered flow management structure (30) retains a body of surface water (31), and control electronics (35) may be configured to perform NMR measurements with the in-situ detection coil (33) to measure NMR properties associated with water (34) within the structure (30). Control electronics (35) can be configured to use the measured NMR properties to determine, or facilitate determination, of engineering performance properties of the structure (30), as well as changes in the engineering performance properties of the structure (30) over time.

In some embodiments according to FIG. 3, a plurality of in-situ detection coils such as in-situ detection coil (33) may be embedded in different locations within the structure (30) to provide localized sensitivity to engineering performance properties of the engineered flow management structure (30). The shape, size and orientation of the embedded in-situ detection coil (33) may be configured to achieve desired measurement objectives. Shapes may include for example circles, squares, and figure-8 geometries. In-situ detection coil (33) may be configured with single or multiple turns to achieve desired measurement objectives. Control electronics (35) may be configured to perform measurements with in-situ detection coil (33), and may be otherwise configured as described herein, e.g., as described in connection with FIG. 1.

Figure 4:
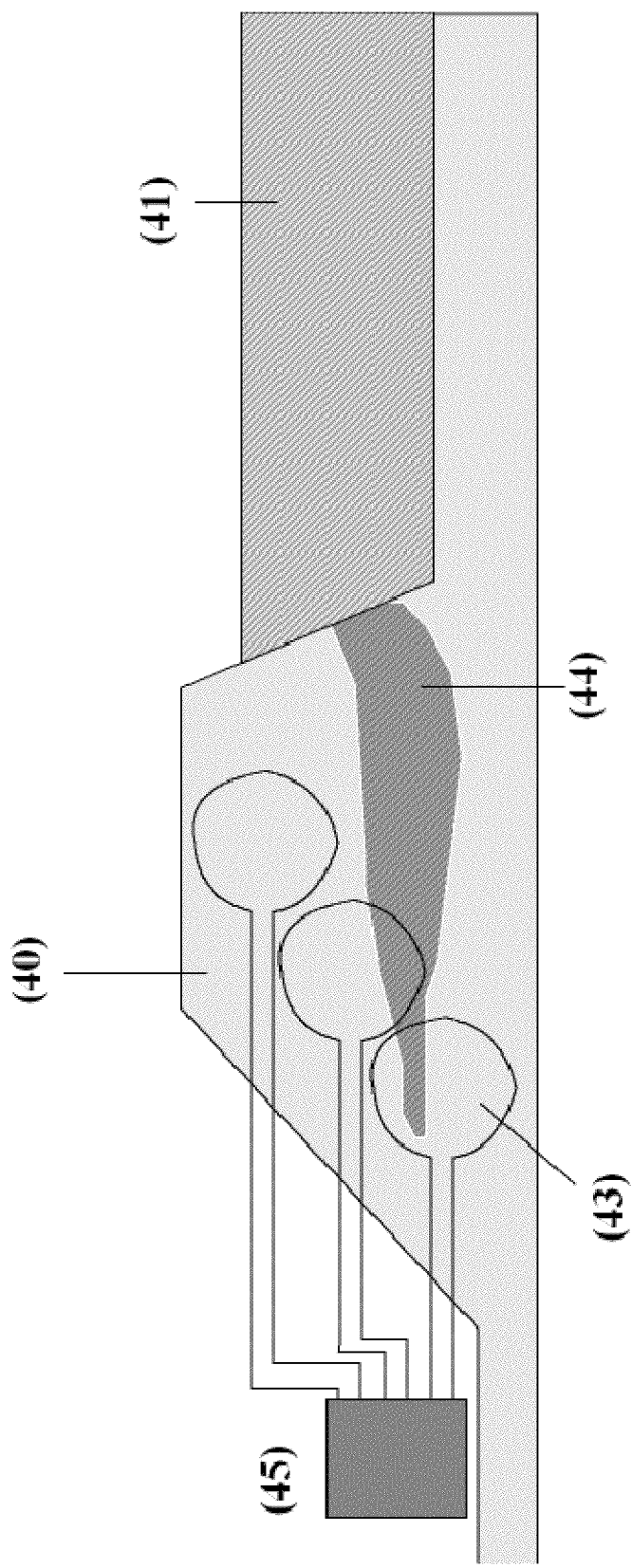
FIG. 4 depicts an example NMR measurement apparatus performing NMR measurements in an engineered flow management structure, wherein the NMR measurement apparatus is coupled with a plurality of detection coils emplaced at different positions within the structure.

FIG. 4 depicts an example NMR measurement apparatus performing NMR measurements in an engineered flow management structure, wherein the NMR measurement apparatus is coupled with a plurality of detection coils emplaced at different positions within the structure. FIG. 4 includes an NMR measurement apparatus comprising a plurality of detection coils (43) and control electronics (45). Detection coils (43) are emplaced at different vertical levels in engineered flow management structure (40). Structure (40) is engineered to prevent flow of water (41). Water or fluid (44) is flowing into structure (40) and NMR properties associated with water or fluid (44) content may be measured by the NMR measurement apparatus. Control electronics (45) may be configured to use the measured NMR properties of fluid (44) to determine, or facilitate determination, of engineering performance properties of the structure (40), as well as changes in the engineering performance properties of the structure (40) over time.

The detection coils (43) may be configured to enable NMR measurement of embedded water content (44) at multiple locations within structure (40), in this example, at multiple depth levels. In some embodiments, methods according to this disclosure may include installing a 1D array of coils by attaching or embedding detection coils (43) in a rigid or flexible cylinder such as a PVC casing to aid in the installation of the detection coils (43). Similarly, a 2D array may be attached to or embedded in a rigid or flexible body, such as a plastic sheet, to aid in installation. The separate detection coils (43) may be operated independently or connected together in a network as may be useful to facilitate measurements, and control electronics (45) may be configured for independent and/or network operation of detection coils (43). In some embodiments, control electronics (45) may be configured to perform NMR measurements by operating detection coils (43) serially, and optionally combining NMR data received from measurements performed with different coils. In the embodiments of FIGS. 3 and 4, control electronics (35) and (45) may be configured to modulate pulse power to achieve additional spatial resolution using any known or new NMR processing methods. These techniques may provide additional NMR measurement data for use in determining, or facilitating determination, of engineering performance properties of the structure (40), as well as changes in the engineering performance properties of the structure (40) over time.

In some embodiments, control electronics (45) may be configured to operate embedded detection coils (43) to excite NMR signals by transmitting short pulses via detection coils (43) at Earth's field frequencies to excite nuclear spins of any fluid content within structure (40), such as water content (44). Control electronics (45) may be configured to measure returned NMR signals as NMR spins within water content (44) precess in Earth's magnetic field.

In other embodiments, control electronics (45) may be configured to use detection coils (43) to excite NMR signals by generating a temporary magnetic field, e.g., by passing a DC current through the detection coils (43), to induce enhanced polarization of the nuclear spins in the water content (44). Control electronics (45) may be configured to then rapidly shut off the field inducing precession of the spins in the background Earth's magnetic field. In such embodiments, control electronics (45) may be configured to use a same coil for polarization as well as detection of the resulting NMR signal, or to use separate coils for polarization and detection of the NMR signal.

Figure 5:
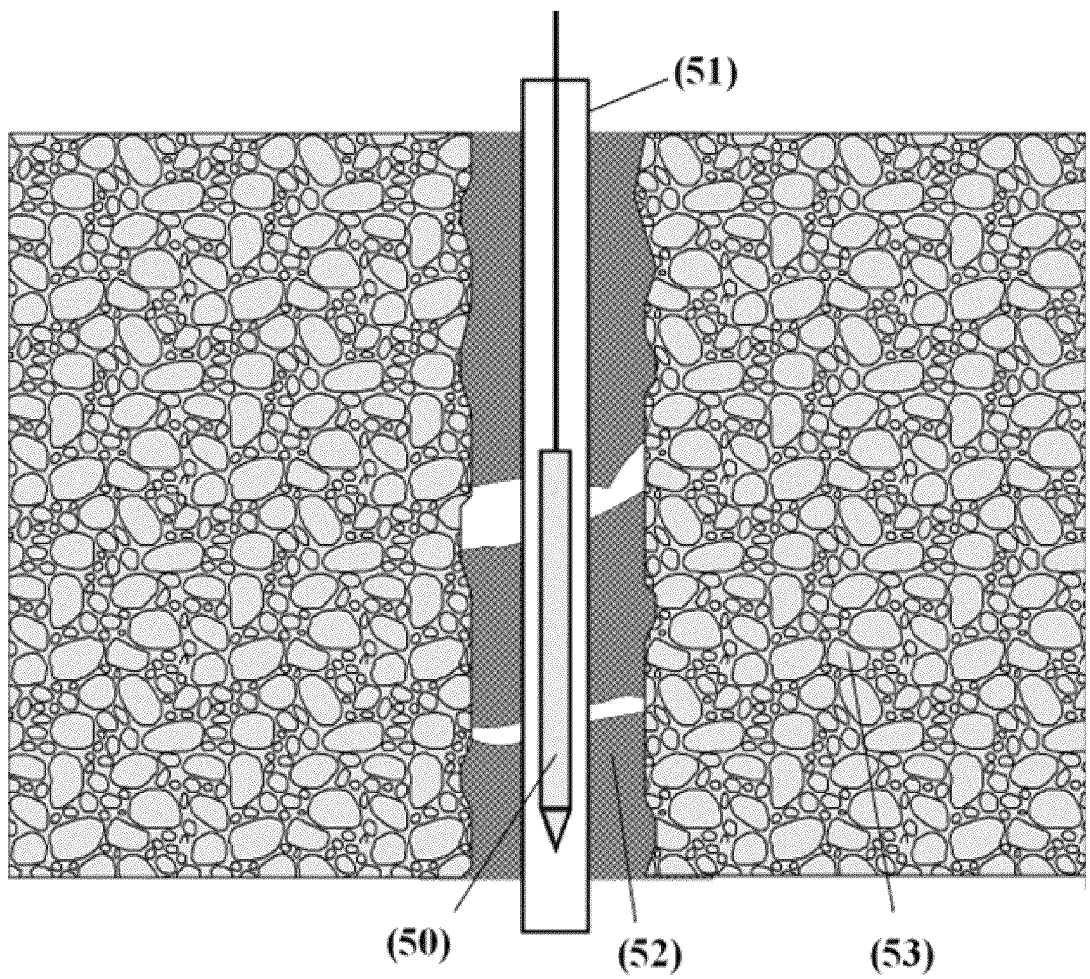
FIG. 5 depicts an example NMR sensor deployed in a well.

FIG. 5 depicts an example NMR sensor deployed in a well. FIG. 5 includes an NMR sensor (50) deployed in an engineered flow management structure comprising a well. The well comprises a well casing (51) and an annular space (52) surrounding the well casing (51) Annular space (52) may be filled with any of a variety of materials to achieve desired engineering performance properties of the well. An undisturbed formation (53) surrounds the annular space (52).

In FIG. 5, NMR sensor (50) may comprise any of the various NMR sensor designs discussed herein. Well casing (51) may comprise any non-metallic well casing. It will be appreciated that techniques applicable to well casing (51) are likewise applicable to pipelines and other underground engineered flow management structures. NMR measurements may be performed, and NMR measurement results may be used to determine engineering performance properties of the well, including properties of the well casing (51) as well as properties within the annular space (52) between the well casing (51) and the undisturbed formation (53).

Embodiments according to FIG. 5 may be used, for example, in methods to inspect the spatial continuity and integrity of the well casing (51) or the material introduced into the annular space (52). Example materials that may be introduced into the annular space (52) include grout, cement, and/or filter-pack materials. In some embodiments, NMR measurements can be made at a single period in time, or at a plurality of measurement times. Measurements made at a single point in time can be used to assess the well integrity during construction thereof and/or after completion, including the engineering performance properties of the well casing (51) and of the material introduced into annular space (52).

In some embodiments, measurements may be performed at a same level within a well, and repeated at multiple points in time. A control device and/or human operator can use resulting measurement data to assess the effects of well development activities, including short term and long term pumping effects, on the engineered or natural materials in the annular space (52) between the well casing (51) and the undisturbed formation (53), or to identify degradation to materials in the annular space (52) and/or well casing (51) over time.

In some embodiments according to FIG. 5, NMR sensor (50) may comprise an in-situ NMR sensor. In some embodiments, NMR sensor (50) may comprise any NMR sensor that can usefully measure NMR properties associated with water and fluids within the annular space (52). Any of the various sensor designs described herein may be employed. NMR sensor (50) may be configured to connect with control electronics which may also be configured according to any of the various embodiments described herein.

Figure 6:
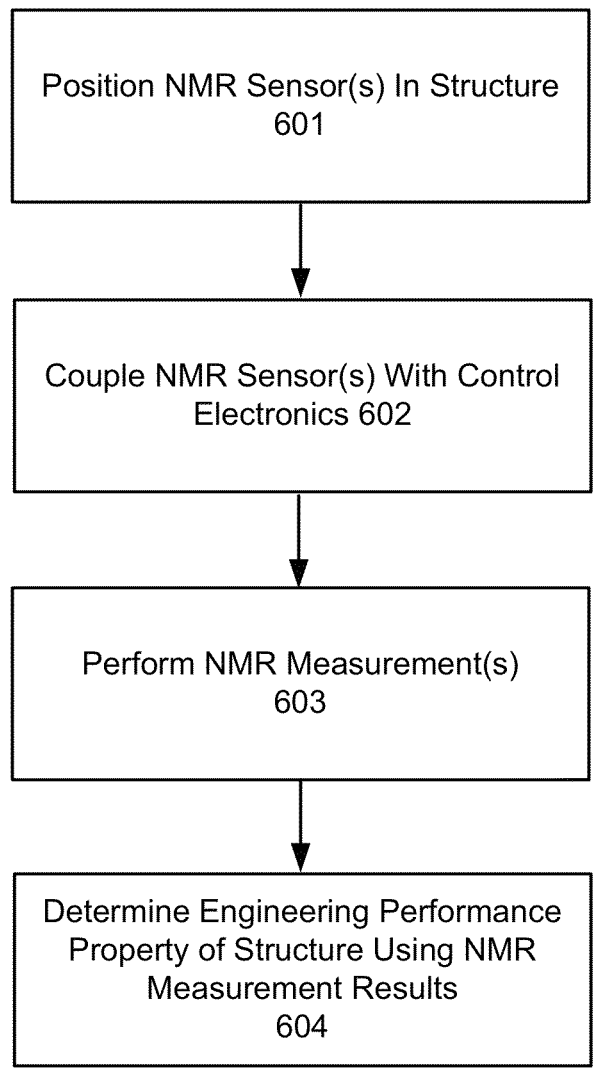
FIG. 6 depicts an example method according to this disclosure.

FIG. 6 depicts an example method according to this disclosure. The illustrated method, implementations and variations thereof will be appreciated from the previous discussion of FIGS. 1-5. The example method includes positioning NMR sensor(s) in an engineered flow management structure in block 601, coupling NMR sensor(s) with control electronics in block 602, performing NMR measurement(s) in block 603, and determining one or more engineering performance properties of the structure using NMR measurement results in block 604. It will be appreciated that the blocks may comprise any of the various aspects of this disclosure and the blocks or portions thereof may be re-ordered in some embodiments.

Figure 7:
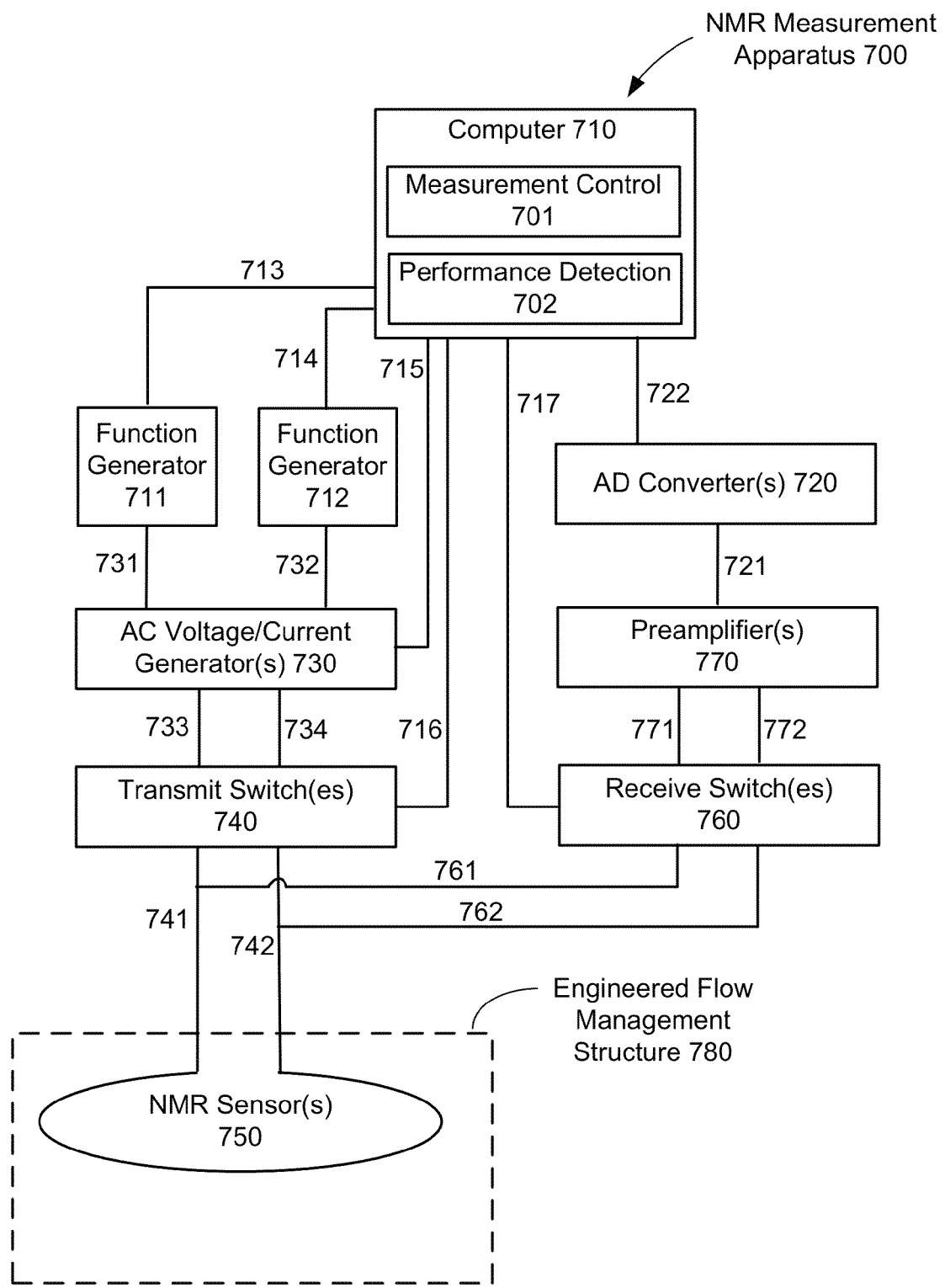
FIG. 7 depicts an example NMR measurement apparatus according to this disclosure.

FIG. 7 depicts an example NMR measurement apparatus according to this disclosure. The example NMR measurement apparatus 700 includes a computer 710, function generators 711, 712, AC voltage/current generator(s) 730, transmit switch(es) 740, NMR sensor(s) 750, receive switch(es) 760, preamplifier(s) 770, and Analog to Digital (AD) converter(s) 720. The NMR sensor(s) 750 are illustrated as an induction coil in an engineered flow management structure 780. Computer 710 comprises measurement control module(s) 701 and performance detection module(s) 702.

In FIG. 7, the computer 710 is coupled to function generators 711, 712 by connections 713 and 714, respectively. The computer 710 is also coupled to AC voltage/current generator(s) 730 by connection 715, to transmit switch(es) 740 by connection 716, to receive switch(es) 760 by connection 717, and to AD converter(s) 720 by connection 722. Furthermore, function generators 711, 712 are coupled to AC voltage/current generator(s) 730 by connections 731 and 732, respectively. AC voltage/current generator(s) 730 are coupled to transmit switch(es) 740 by connections 733 and 734. Transmit switch(es) 740 are coupled to both ends 741 and 742 of the induction coil implementing NMR sensor(s) 750. The ends of the induction coil(s) 741 and 742 are coupled to receive switch(es) 760 by connections 761 and 762, respectively. Receive switch(es) 760 are coupled to preamplifier(s) 770 by connections 771 and 772. Preamplifier(s) 770 are coupled to AD converter(s) 720 by connection 721.

In general, with regard to FIG. 7, measurement control module(s) 701 may be configured to perform NMR measurements with the various other illustrated components of the NMR measurement apparatus 700. For example, the various components may be operated to produce current pulses on the NMR sensor(s) 750, to thereby create NMR excitation pulses in the structure 780. The computer 710 may be configured to produce a pulse by selecting a pulse phase, and activating the AC voltage/current generator(s) 730. The computer 710 may be configured to select a pulse phase for example by activating a function generator 711 or 712 corresponding to a desired pulse phase, so that the selected function generator 711 or 712 provides an input pulse phase to the AC voltage/current generator(s) 730, which is then amplified by the AC voltage/current generator(s) 730 to produce a corresponding pulse on the NMR Sensor(s) 750. The computer 710 may also optionally be configured to close one or more transmit switch(es) 740 when activating the AC voltage/current generator(s) 730, and open the transmit switch(es) 740 after activating the AC voltage/current generator(s) 730.

NMR measurement apparatus 700 may also be configured to receive and record NMR signal data received via the NMR sensor(s) 750. NMR measurement apparatus 700 may be configured to receive and record NMR signal data after one or more excitation pulses. In some embodiments, the computer 710 may be configured to close the receive switch(es) 760 after a pulse. The preamplifier(s) 770 amplify NMR signals received via induction coil(s) 750. The AD converter(s) 720 convert the received and amplified signals to digital NMR signal data, e.g. by sampling received NMR signals at a desired sampling rate, and the computer 710 or other device equipped with storage media may be configured to store the resulting digital NMR signal data.

In some embodiments, the performance detection module 702 may be configured to process NMR measurement data from structure 780, generated by operation of the measurement control module 701 and the various other components of NMR measurement apparatus 700. Performance detection module 702 may be configured to use measured NMR properties to determine and/or facilitate determination of any of a variety of engineering performance properties described herein. It will be appreciated that while the computer 710 may be configured to include performance detection module 702, in some embodiments NMR measurements and engineering performance property determination may be performed separately, e.g., by first performing measurements with system 700, then processing acquired NMR data at a later time and/or with a different computing device or by a human operator.

It will be appreciated that NMR measurement apparatus may be configured differently than illustrated in FIG. 7 in some embodiments. To recite just a few of the many possible configuration options, computer 710 may be programmed with software that controls the generation of pulse sequences and the acquisition of data. A set of data acquisition devices may comprise devices configured generate the control signals for the pulse sequences, such as function generators 711, 712, and AD converter(s) 720 that receive, convert and/or record NMR signals. The AC voltage/current generator(s) 730 may be configured to generate one or more current pulses in the induction coil(s) 750 in a transmit mode, to induce a coherent precession of NMR spins in fluid content in the structure 780. Optional transmit switch(es) 740 may be configured to isolate transmitter noise from the receive circuitry during a receive mode. NMR sensor(s) 750 may be arranged other than as induction coils, and may be configured in a variety of ways as described herein or as known or as may be developed in the art. Optional receive switch(es) 760 may be configured to isolate the receive preamplifier(s) 770 from the potentially large voltage on the NMR sensor(s) 750 during transmit mode. Optional preamplifier(s) 770 may be configured to amplify the detected NMR signals prior to digitization by the AD converter(s) 720. The optional transmit switch(es) 740 and receive switch(es) 760 may comprise active devices such as relays, and/or passive devices such as diodes. Optional tuning capacitors, not shown in FIG. 7, may be used in the transmit mode to increase the transmitted current in the induction coil(s) 750, and/or in receive mode to increase the amplitude of the NMR signal voltage across the terminals of the induction coil(s) 750.

In some embodiments, NMR sensor(s) 750 may comprise an array of coils comprising one or more transmit coils, one or more receive coils, and/or one or more combination transmit and receive coils. For example, NMR sensor(s) 750 may comprise one transmit coil and multiple receive coils. NMR sensor(s) 750 may comprise one combination transmit and receive coil, and multiple receive coils. NMR sensor(s) 750 may comprise multiple combination transmit and receive coils. These and other multicoil arrangements may be configured in some embodiments as will be appreciated. Multicoil arrangements are useful for localization of fluids in structure 780, as described for example in U.S. Pat. No. 7,466,128, entitled "Multicoil Data Acquisition and Processing Methods," issued Dec. 16, 2008, which is incorporated by reference herein.

Any combination of hardware and software that enables the acquisition and processing of NMR signals is suitable to implement embodiments of this disclosure. An architecture to implement the disclosed methods could comprise, for example, elements illustrated in FIG. 7, such as an AC voltage and current generator 730, a digital control system implemented at least in part by computer 710, a transmit switching circuit including transmit switch(es) 740, a receive switching circuit including receive switch(es) 760, a multi-channel receive circuit including, e.g., a plurality of induction coils in NMR sensor(s) 750, preamplifier(s) 770, a digital acquisition system including AD converter(s) 720, a digital storage device which may be implemented within computer 710 or other digital storage device, and a digital computer 710 equipped with engineering property determination software. The switching circuits may transition a system such as 700 between a transmit-mode, when the coil(s) 750 are connected to the transmit circuit, and receive-mode when the coil(s) 750 are connected to the receive circuit.

In general, NMR measurements may be collected by transmitting one or more pulses of alternating current through NMR sensor(s) 750. The alternating current may be tuned to the Larmor frequency of hydrogen nuclei, for example, and may generate a magnetic field in the structure 780 alternating at the Larmor frequency. The alternating magnetic field radiates into the structure 780 and modifies the nuclear magnetization state of hydrogen atoms present in fluids in structure 780. The transmitted alternating magnetic field perturbs the magnetization from equilibrium alignment in a static magnetic field, so that some component of the nuclear magnetization rotates into the transverse "xy" plane. Once rotated from equilibrium, the magnetization relaxes over time back to the equilibrium state over time, decaying from the transverse plane and re-growing along the longitudinal axis. The rotation of the magnetization by the transmitted pulse(s) and subsequent relaxation to equilibrium are described by the phenomenological Bloch equations. The evolution of the magnetization under the Bloch equations depends on several variables including the amplitude of the transmitted field, the duration and timing of the transmitted field, the phase of the transmitted field, the longitudinal relaxation time T1, FID relaxation rate T2*, and/or the spin-spin relaxation time T2 of the hydrogen nuclei under investigation. These aspects of NMR measurement may be used in determining the various NMR properties described herein.

The foregoing detailed description has set forth various embodiments of the devices and/or processes via the use of diagrams and examples. Insofar as such examples contain one or more functions and/or operations, it will be understood by those within the art that each function and/or operation within such examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

While various embodiments have been disclosed herein, other aspects and embodiments will be apparent to those skilled in art.

The invention claimed is:

1. A method for determining an engineering property of an engineered flow management structure comprising:
    positioning an in-situ Nuclear Magnetic Resonance (NMR) sensor inside an engineered flow management structure comprising a dam, a levee, a canal, a well casing, an annular space between a well casing or underground pipeline and an undisturbed earth formation, a slurry wall, a grout curtain, or a retaining wall;
    coupling the in-situ NMR sensor with a NMR measurement control electronics;
    performing one or more NMR measurements with said in-situ NMR sensor and NMR measurement control electronics, wherein:
        one or more of the earth's magnetic field and a static magnetic field generation device is used as a source of a static magnetic field for the series of NMR measurements;

electromagnetic pulses are transmitted at a Larmor frequency of the static magnetic field to generate an NMR excitation signal; and one or more NMR measurement results are produced by performing the one or more NMR measurements; and determining an engineering property of the engineered flow management structure using one or more of the NMR measurement results, wherein the engineering property comprises one or more of a mechanical, hydraulic, or structural property.

2. The method of claim 1 wherein performing one or more NMR measurements comprises performing NMR measurements of one or more of fluid saturation, porosity, mean pore size, pore size distribution, permeability, tortuosity, density, flow velocity or fluid diffusion.

3. The method of claim 1 wherein performing one or more NMR measurements comprises performing a series of NMR measurements at multiple points in time, and wherein determining the engineering property of the engineered flow management structure comprises comparing NMR measurement results from the series of NMR measurements to determine a change in the engineering property.

4. The method of claim 1 wherein the engineered flow management structure comprises the dam, the levee, the canal, the slurry wall, the grout curtain, the retaining wall, or the annular space between a well casing or underground pipeline and an undisturbed earth formation.

5. The method of claim 1 where in the engineered flow management structure comprises the well casing.

6. The method of claim 1 wherein the engineered flow management structure comprises the annular space between a well casing or underground pipeline and an undisturbed earth formation, and wherein the annular space comprises a material selected to permit or impede fluid flow within the annular space.

7. The method of claim 1 wherein the earth's magnetic field is used as the source of the static magnetic field for the series of NMR measurements.

8. The method of claim 1 wherein one or more static magnetic field generation devices are used as the source of the static magnetic field for the one or more NMR measurements.

9. The method of claim 1 further comprising generating and terminating a prepolarizing background magnetic field to generate an NMR excitation signal.

10. The method of claim 1 further comprising deploying the in-situ NMR sensor inside of the engineered flow management structure using a borehole or access tube in the engineered flow management structure.

11. The method of claim 1 further comprising determining deterioration in the engineering properties of the engineered flow management structure.

12. The method of claim 1 further comprising determining stabilization or improvement in the engineering properties of the engineered flow management structure.

13. The method of claim 1 wherein the in-situ NMR sensor comprises an induction coil, a superconducting quantum interference device (SQUID), or a micromechanical cantilever.

14. The method of claim 1 where in the engineered flow management structure comprises the well casing.

15. An apparatus configured determining an engineering property of an engineered flow management structure, the apparatus comprising:

an in-situ Nuclear Magnetic Resonance (NMR) sensor deployed inside an engineered flow management structure comprising a dam, a levee, a canal, a well casing, an annular space between a well casing or underground pipeline and an undisturbed earth formation, a slurry wall, a grout curtain, or a retaining wall; and NMR measurement control electronics coupled with the in-situ NMR sensor, wherein:

the NMR measurement control electronics are configured to perform one or more NMR measurements with said in-situ NMR sensor using one or more of the earth's magnetic field and a static magnetic field generation device as a source of a static magnetic field for the series of NMR measurements;

the NMR measurement control electronics are configured to transmit electromagnetic pulses at a Larmor frequency of the static magnetic field to generate NMR excitation signals for the series of NMR measurements;

the NMR measurement control electronics are configured to store one or more NMR measurement results produced by performing the one or more NMR measurements; and the NMR measurement control electronics are configured to determine an engineering property of the engineered flow management structure using one or more of the NMR measurement results, wherein the engineering property comprises one or more of a mechanical, hydraulic, or structural property.

16. The apparatus of claim 15 wherein the NMR measurement control electronics are configured to perform one or more NMR measurements of one or more of fluid saturation, porosity, mean pore size, pore size distribution, permeability, tortuosity, density, flow velocity or fluid diffusion.

17. The apparatus of claim 15 wherein the NMR measurement control electronics are configured to perform a series of NMR measurements at multiple points in time and to determine the engineering property of the engineered flow management structure by comparing NMR measurement results from the series of NMR measurements to determine a change in the engineering property.

18. The apparatus of claim 15 wherein the engineered flow management structure comprises the annular space between a well casing or underground pipeline and an undisturbed earth formation, and wherein the annular space comprises a material selected to permit or impede fluid flow within the annular space.

19. The apparatus of claim 15 wherein the apparatus is configured to use the earth's magnetic field as the source of the static magnetic field for the series of NMR measurements.

20. The apparatus of claim 15 wherein the apparatus is configured to use one or more static magnetic field generation devices as the source of the static magnetic field for the series of NMR measurements.

21. The apparatus of claim 15 wherein the NMR measurement control electronics are configured to generate and terminate prepolarizing background magnetic fields to generate NMR excitation signals.

22. The apparatus of claim 15 wherein the in-situ NMR sensor is deployed inside of the engineered flow management structure within a borehole or access tube in the engineered flow management structure.

23. The apparatus of claim 15 wherein the NMR measurement control electronics are configured to use the one or more NMR measurement results from the one or more NMR measurements to determine deterioration in the engineering property of the engineered flow management structure.

24. The apparatus of claim 15 wherein the NMR measurement control electronics are configured to use the one or more measurement results from the one or more NMR measurements to determine stabilization or improvement in the engineering property of the engineered flow management structure.

25. The apparatus of claim 15 wherein the in-situ NMR sensor comprises an induction coil, a superconducting quantum interference device (SQUID), or a micromechanical cantilever.

26. The apparatus of claim 15 wherein the engineered flow management structure comprises the dam, the levee, the canal, the slurry wall, the grout curtain, the retaining wall, or the annular space between a well casing or underground pipeline and an undisturbed earth formation.

\* \* \* \* \*